(12) United States Patent
Sun et al.

(10) Patent No.: US 11,953,942 B2
(45) Date of Patent: Apr. 9, 2024

(54) FOLDABLE ELECTRONIC DEVICE HAVING MULTIPLE SCREENS

(71) Applicant: Acer Incorporated, New Taipei (TW)

(72) Inventors: Hui-Ping Sun, New Taipei (TW); Yen-Chou Chueh, New Taipei (TW); Chun-Hung Wen, New Taipei (TW); Chun-Hsien Chen, New Taipei (TW)

(73) Assignee: Acer Incorporated, New Taipei (TW)

( * ) Notice: Subject to any disclaimer, the term of this patent is extended or adjusted under 35 U.S.C. 154(b) by 523 days.

(21) Appl. No.: 17/178,252

(22) Filed: Feb. 18, 2021

(65) Prior Publication Data
US 2022/0019263 A1    Jan. 20, 2022

(30) Foreign Application Priority Data

Jul. 14, 2020 (TW) ................................ 109208929

(51) Int. Cl.
*G06F 1/16* (2006.01)
*H05K 5/00* (2006.01)
*H05K 5/02* (2006.01)

(52) U.S. Cl.
CPC .......... *G06F 1/1641* (2013.01); *G06F 1/1622* (2013.01); *G06F 1/1647* (2013.01); *H05K 5/0018* (2022.08); *H05K 5/0217* (2013.01)

(58) Field of Classification Search
CPC .... G06F 1/1641; G06F 1/1622; G06F 1/1647; G06F 1/1616; H05K 5/0018; H05K 5/0217
See application file for complete search history.

(56) References Cited

U.S. PATENT DOCUMENTS

| | | | | |
|---|---|---|---|---|
| 5,768,096 A | * | 6/1998 | Williams | G06F 1/1616 361/679.04 |
| 8,488,306 B2 | * | 7/2013 | Mickey | F16M 13/022 361/679.04 |
| 9,766,850 B2 | * | 9/2017 | Eisenberg | G06F 3/1431 |
| 10,082,832 B1 | * | 9/2018 | Wang | G06F 1/1681 |
| 11,209,869 B2 | * | 12/2021 | Hudgins | G06F 1/1654 |
| 11,627,675 B2 | * | 4/2023 | Eisenberg | G06F 1/1624 361/807 |
| 2020/0409645 A1 | * | 12/2020 | Clark | G06F 1/3265 |
| 2021/0080999 A1 | * | 3/2021 | Bryant | G06F 1/1641 |
| 2021/0120685 A1 | * | 4/2021 | Zhu | H05K 5/0017 |
| 2022/0124923 A1 | * | 4/2022 | Zhang | G06F 1/1652 |
| 2022/0418124 A1 | * | 12/2022 | Liu | H05K 5/0017 |

* cited by examiner

*Primary Examiner* — Sagar Shrestha
(74) *Attorney, Agent, or Firm* — JCIPRNET

(57) ABSTRACT

A foldable electronic device having multiple screens is provided. The foldable electronic device includes a first screen, a worm rod, a moving member, at least one second screen, and at least one linking rod. The worm rod is rotatably disposed on the first screen. The moving member is coupled to the worm rod to move along the worm rod when the worm rod rotates. The second screen is movably disposed on the first screen. The linking rod is pivotally connected between the moving member and the second screen. When the moving part moves along the worm rod, the second screen is driven to move away from or closed to the worm rod by the linking rod, so that the second screen moves out of the first screen or is accommodated behind the first screen.

9 Claims, 4 Drawing Sheets

FOLDABLE ELECTRONIC DEVICE HAVING MULTIPLE SCREENS

CROSS-REFERENCE TO RELATED APPLICATION

This application claims the priority benefit of Taiwanese application serial no. 109208929, filed on Jul. 14, 2020. The entirety of the above-mentioned patent application is hereby incorporated by reference herein and made a part of this specification.

BACKGROUND

Technical Field

The disclosure is related to a foldable electronic device, and particularly to a foldable electronic device having multiple screens.

Description of Related Art

With the increasing speed of information transmission, people are satisfied with using a single window or a single screen. In conventional flat panel display devices, it is necessary to constantly alternate between multiple windows opened at the same time depending on needs, which thus causes burden on users. Alternation between windows also interferes continuous processing of a single event. When several windows are required to be displayed on a single screen at the same time, the size of the windows needs to be reduced, which causes contents of the windows unable to be exhibited completely and clearly. Therefore, there is a need for an electronic device that provides multiple screens.

In particular, most of existing notebook computers only have a single screen for use. When two or more screens are required to be used, additional display devices need to be connected to the notebook computers. However, the additional display devices and the screens of the notebook computers have positional differences, and usually different dimensions, which thus causes visual discomfort resulted from difficulty in coordination between the displayed images. In addition, when users carry the notebook computers elsewhere for use, the users need to reconnect the same to other display device models, which also leads to inconvenience to the users.

SUMMARY

The disclosure provides a foldable electronic device having multiple screens, in which at least one second screen is moved out of, or moved into and hidden behind the first screen by a driving mechanism, thereby providing multiple-screen display and accommodation effects.

The foldable electronic device having multiple screens of the disclosure includes a first screen, a worm rod, a moving part, at least one second screen, and at least one linking rod. The worm rod is rotatably disposed on the first screen. The moving part is coupled to the worm rod to move along the worm rod when the worm rod rotates. The second screen is movably disposed on the first screen. The linking rod is pivotally connected between the moving part and the second screen to drive the second screen to move away from or close to the worm rod when the moving part moves along the worm rod, so that the second screen is moved out of the first screen or accommodated behind the first screen.

Based on the foregoing, in the foldable electronic device, through movably disposing at least one second screen behind the first screen, and employing the worm rod, the moving part, and linking rod as a driving mechanism thereof, the second screen can be driven to move with respect to the first screen through the moving part and linking rod when the worm rod rotates. Thereby, the user is able to pull out or move in the second screen from behind the first screen, which satisfies the needs of the users for single-screen display or multiple-screen display.

In addition, since the second screen and the related driving mechanism are both disposed behind the first screen, the user can be provided with a better visual effect during operation. In other words, through the abovementioned component configuration, the first screen of the disclosure can also serve as an accommodation space for the second screen and the driving mechanism to prevent interference between mechanisms from occurring during no matter a single-screen operation or a multiple-screen operation of the foldable electronic device.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
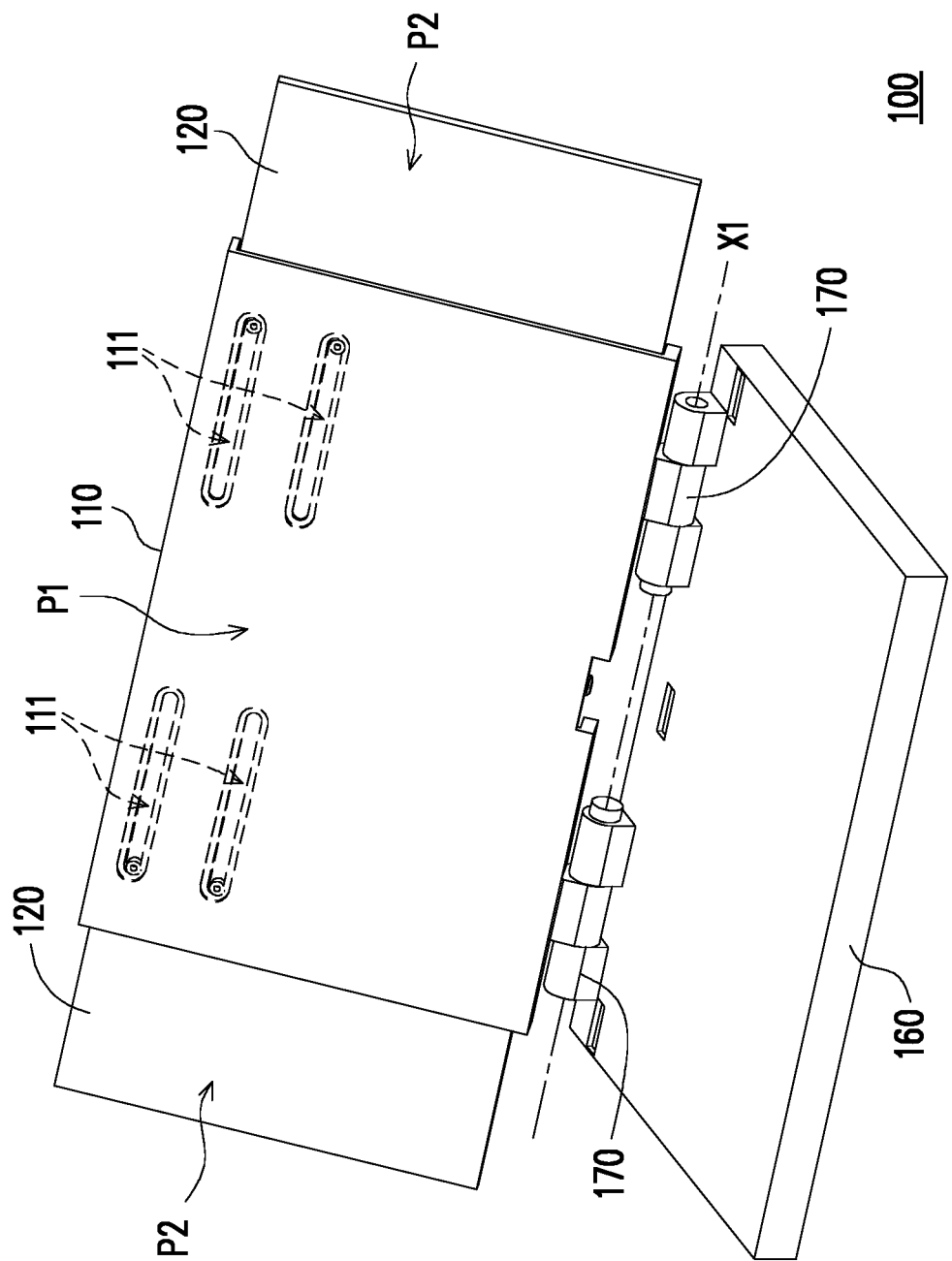
FIG. 1 is a schematic diagram of a foldable electronic device according to an embodiment of the disclosure.
Figure 2:
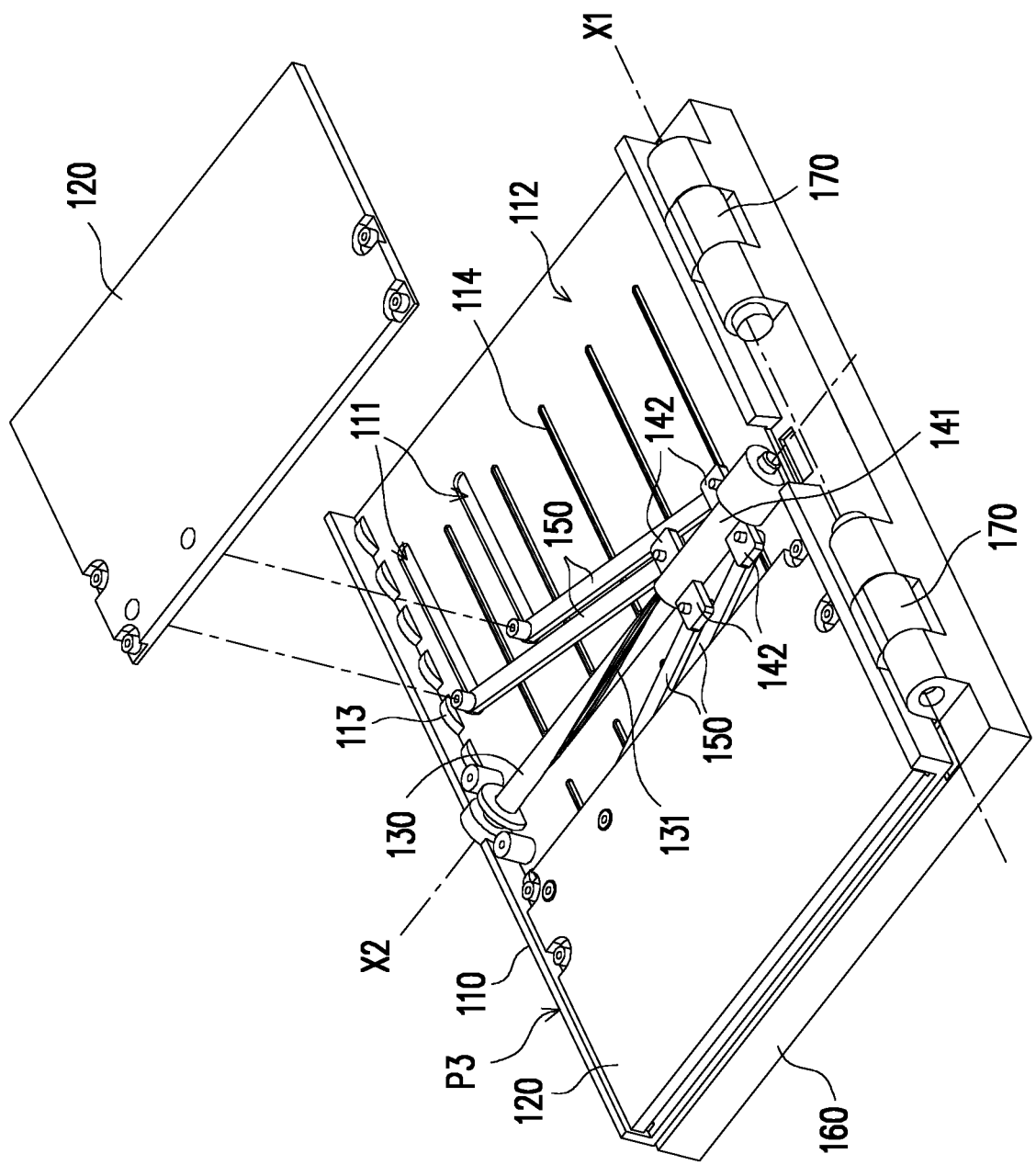
FIG. 2 is an exploded view of some components of the foldable electronic device of FIG. 1 in another state.
Figure 3:
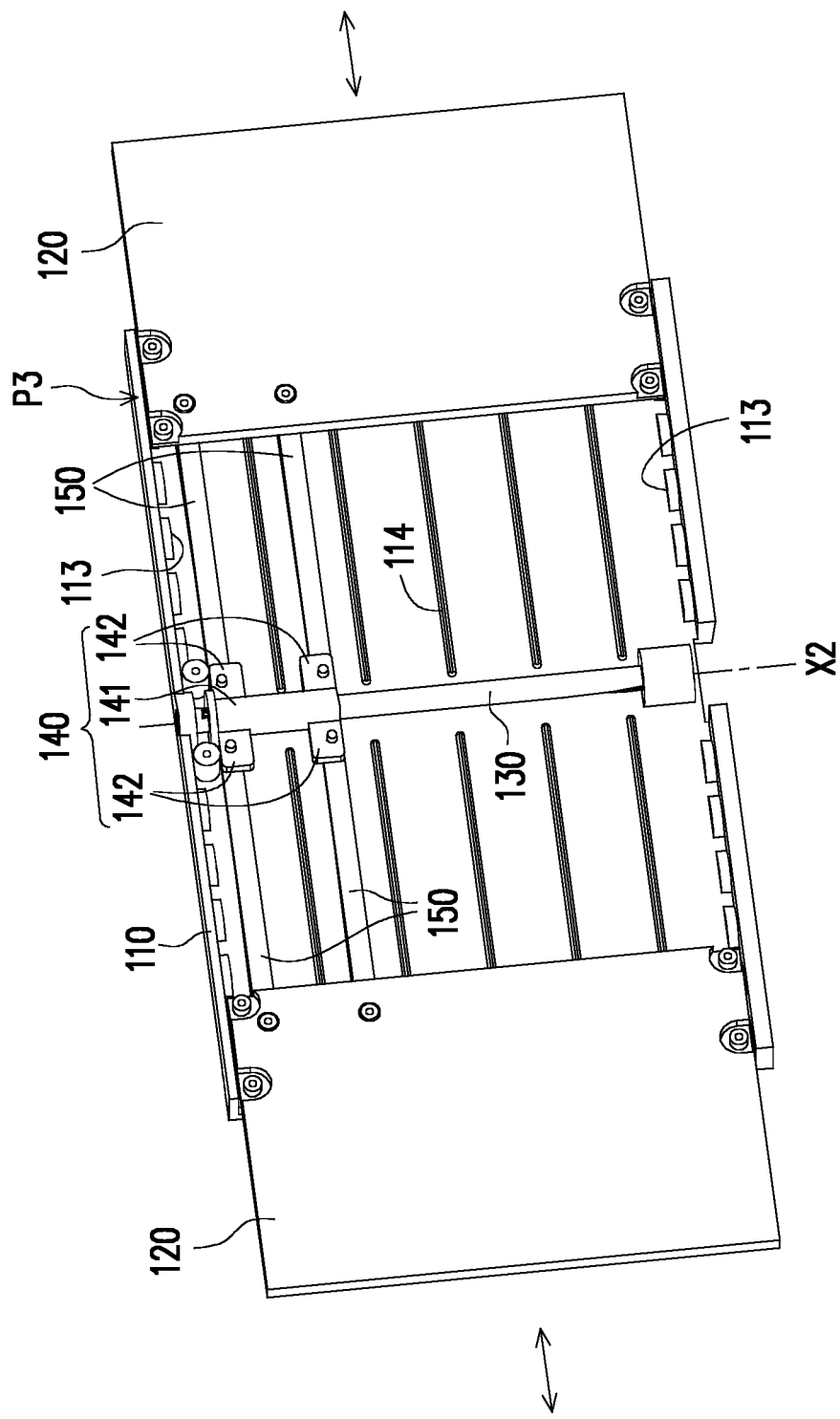
FIG. 3 is a schematic diagram of some components of the foldable electronic device of FIG. 1 from another perspective.

FIG. 1 is a schematic diagram of a foldable electronic device according to an embodiment of the disclosure. FIG. 2 is an exploded view of some components of the foldable electronic device of FIG. 1 in another state. FIG. 3 is a schematic diagram of some components of the foldable electronic device of FIG. 1 from another perspective. Referring to FIGS. 1 to 3 at the same time, in this embodiment, a foldable electronic device 100, such as a notebook computer that provides multiple-screen displaying, includes a first screen 110, a worm rod 130, a moving part 140, a shaft 170, at least one second screen 120 (e.g., two second screens 120 described herein), and at least one linking rod 150 (e.g., a plurality of linking rods 150 corresponding to the number of the second screens 120 described herein).

The worm rod 130 is rotatably disposed on the first screen 110. The moving part 140 is coupled to the worm rod 130 to move along the worm rod 130 when the worm rod 130 rotates. The second screens 120 are movably disposed on the first screen 110. The linking rods 150 are pivotally connected between the moving part 140 and the second screens 120 to drive the second screens 120 to move away from or close to the worm rod 130 when the moving part 140 moves along the worm rod 130. Thereby, the second screens 120 are moved out of the first screen 110 or accommodated behind the first screen 110.

In this embodiment, the second screens 120 are disposed on the first screen 110, and the first screen 110 is connected to a body 160 through the shaft 170 to rotate along an axis X1 with respect to the body 160 through the shaft 170, which results in an unfolded state shown in FIG. 1, and a folded state shown in FIG. 2. Accordingly, when the first screen 110 is unfolded with respect to the body 160 through the shaft 170, a user may pull out or move in the second screens 120 from behind the first screen 110 depending on needs. Therefore, the foldable electronic device 100 has both single-screen (i.e., only the first screen 110) and multiple-screen (i.e., at least one second screen 120 in addition to the first screen 110) display functions.

As shown in FIG. 2 and FIG. 3, the second screens 120, the worm rod 130, and the linking rods 150 are all located on the same surface of the first screen 110 (i.e., a back surface P3), and are opposite to a display surface P1 of the first screen 110. In other words, the first screen 110 has the display surface P1, the back surface P3 opposite to the display surface P1, and a groove structure 112 on the back surface P3. The second screens 120 are movably disposed on the groove structure 112 to be completely moved into the groove structure 112 or partially moved out of the groove structure 112. Herein, a pair of second screens 120 are respectively disposed on two opposite sides of the worm rod 130, the first screen 110 further has a plurality of ribs 113 and 114 located on the groove structure 112, and the second screens 120 movably abut the ribs 113 and 114 to reduce a contact area between the second screens 120 and the first screen 110, which also enables a smooth sliding movement of the second screens 120 with respect to the first screen 110.

Moreover, the first screen 110 also has a track 111 located on the back surface P3, and the pair of second screens 120 are respectively connected to the same moving part 140 through the plurality of linking rods 150. Therefore, when the moving part 140 moves along the worm rod 130, the pair of second screens 120 can be synchronously driven by the linking rods 150 to move out of or into the first screen 110. To be specific, the worm rod 130 has a threaded groove 131, and the moving part 140 includes a sleeve 141 and blade portions 142 located on two opposite sides of the sleeve 141. In the sleeve 141, there is, for example, a guide column (not shown) movably coupled to the groove 131 to move the moving part 140 along the worm rod 130 through cooperation between the guide column and the groove 131 when the worm rod 130 rotates along the axis X2, as shown in FIGS. 2 and 3. Herein, FIG. 3 shows the same state as shown in FIG. 1, namely the second screens 120 being pulled out from the back surface P3 of the first screen 110. Herein, the display surface P1 of the first screen 110 and display surfaces P2 of the second screens 120 face the same direction.

Furthermore, the linking rods 150 each have an end pivotally connected to the moving part 140, and an other end pivotally connected to the corresponding second screen 120 and movably coupled to the track 111 at the same time. An extension direction of the track 111 is orthogonal to an extension direction of the worm rod 130. Therefore, when the moving part 140 moves along the worm rod 130 when the worm rod 130 rotates, the second screens 120 can be synchronously driven to move close to or away from the worm rod 130 through the linking rods 150. Herein, each of the second screens 120 is correspondingly coupled to the plurality of linking rods 150, and those linking rods 150 corresponding to the same second screen 120 are parallel to each other, which maintains stability of the second screens 120 and prevents twisting the same when the moving part 140 synchronously drives the pair of second screens 120 through the linking rods 150.

Figure 4:
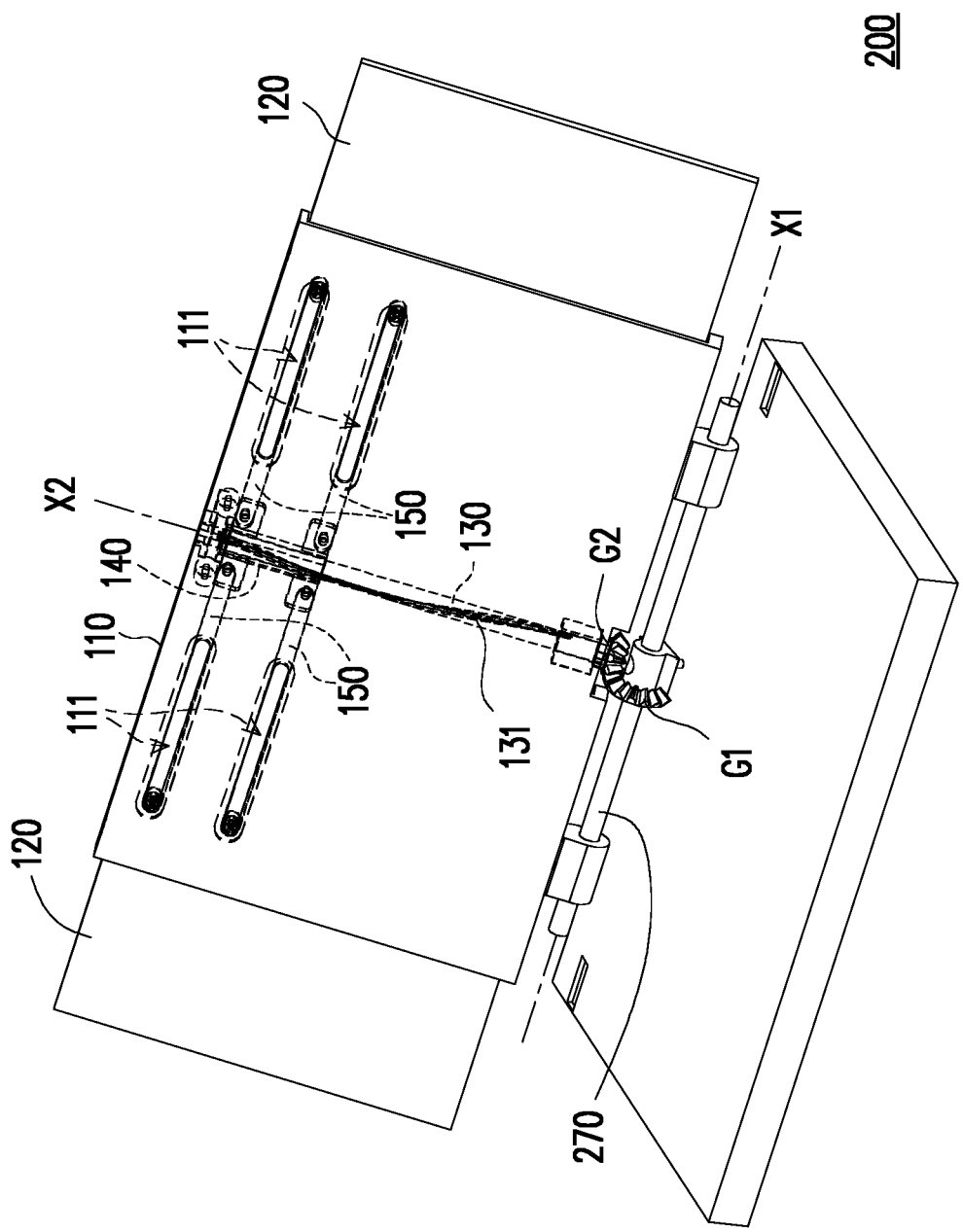
FIG. 4 is a schematic diagram of a foldable electronic device according to another embodiment of the disclosure.

FIG. 4 is a schematic diagram of a foldable electronic device according to another embodiment of the disclosure. Referring to FIG. 4, this embodiment is different from the abovementioned embodiment in that a foldable electronic device 200 further includes an orthogonal gear set, which is disposed between the worm rod 130 and a shaft 270, so that when the first screen 110 is rotated and unfolded/folded through the shaft 270, the shaft 270 can also drive the worm rod 130 to rotate along the axis X2 through the orthogonal gear set. Herein, the orthogonal gear set includes a first helical gear G1 and a second helical gear G2 which are meshed with each other, the first helical gear G1 is coaxially assembled to the shaft 270 so that the first helical gear G1 and the shaft 270 rotate synchronously, and the second helical gear G2 is coaxially assembled to the worm rod 130 so that the second helical gear G2 and the worm rod 130 rotate synchronously.

In this way, while the first screen 110 rotates through the shaft 270, the worm rod 130 also rotates synchronously through the meshing relationship between the first helical gear G1 and the second helical gear G2. Thereby, during the unfolding process of the foldable electronic device 200, the second screens 120 are gradually moved out from behind the first screen 110, or during the folding process of the foldable electronic device 200, the second screens 120 is gradually moved in behind the first screen 110.

In summary of the foregoing, in the foldable electronic device in the embodiments of the disclosure, through movably disposing at least one second screen behind the first screen, and employing the worm rod, the moving part, and the linking rods as the driving mechanism, the second screen can be driven to move with respect to the first screen through the moving part and the linking rods when the worm rod rotates. Thereby, the user is able to pull out or move in the second screen behind the first screen, which satisfies the requirement of the user for single-screen display or multiple-screen display.

In addition, since the second screen and the related driving mechanism are both disposed behind the first screen, the user can be provided with a better visual effect during operation. In other words, through the abovementioned component configuration, the first screen of the disclosure can also serve as an accommodation space for the second screen and the driving mechanism to prevent interference between mechanisms from occurring during no matter a single-screen operation or a multiple-screen operation of the foldable electronic device.

Moreover, when the foldable electronic device is provided with two second screens, and when the plurality of linking rods respectively connect the second screens to the same moving part so that the worm rod rotates and drives the moving part, the second screens can be synchronously driven to move out of the first screen or move into the back surface of the first screen through the linking rods to achieve an effect of synchronous driving through an umbrella frame structure composed of the worm rod, the moving part, and the linking rods.

Furthermore, through the orthogonal gear set disposed between the worm rod and the shaft, the foldable electronic device can accomplish moving out or moving in the second screens during the process of rotating and unfolding/folding of the screen, thereby providing additional operational modes accordingly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A foldable electronic device having multiple screens, comprising:
    a first screen;
    a worm rod rotatably disposed on the first screen;
    a moving part coupled to the worm rod to move along the worm rod when the worm rod rotates;
    at least one second screen movably disposed on the first screen; and
    at least one linking rod pivotally connected between the moving part and the second screen to drive the second screen to move away from or close to the worm rod when the moving part moves along the worm rod, such that the second screen is moved out of the first screen or accommodated behind the first screen, wherein the first screen has a display surface and a back surface opposite to the display surface, and at least one track located on the back surface, the linking rod has an end pivotally connected to the moving part and an other end pivotally connected to the second screen and movably coupled to the track, and an extension direction of the track is orthogonal to an extension direction of the worm rod.

2. The foldable electronic device having multiple screens as described in claim 1, wherein the second screen, the worm rod, and the linking rod are located on a same surface of the first screen and are opposite to a display surface of the first screen.

3. The foldable electronic device having multiple screens as described in claim 1, wherein the at least one second screen further comprises a pair of second screens and the at least one linking rod further comprises pairs of linking rods, wherein the pair of second screens are respectively located on two opposite sides of the worm rod, and the pairs of linking rods are pivotally connected between blade portions of the moving part and the pair of second screens, so that when the worm rod rotates and drives the moving part, the pair of second screens are driven to synchronously move close to or synchronously move away from the worm rod through the pairs of linking rods.

4. The foldable electronic device having multiple screens as described in claim 3, wherein each of the second screens is correspondingly coupled to one pair of the linking rods, and the pair of the linking rods comprises two linking rods parallel to each other.

5. The foldable electronic device having multiple screens as described in claim 1, wherein the first screen has a display surface, a back surface opposite to the display surface, and a groove structure located on the back surface, and the second screen is movably disposed on the groove structure to be completely moved into the groove structure or partially moved out of the groove structure.

6. The foldable electronic device having multiple screens as described in claim 5, wherein the first screen further has a plurality of ribs located on the groove structure, and the second screen movably abuts the plurality of ribs to reduce a contact area between the second screen and the first screen.

7. The foldable electronic device having multiple screens as described in claim 1, further comprising a body and a shaft, and the first screen is connected to the body to be rotated and unfolded or folded with respect to the body through the shaft.

8. The foldable electronic device having multiple screens as described in claim 7, further comprising an orthogonal gear set disposed between the worm rod and the shaft, wherein when the first screen is rotated and unfolded or folded with respect to the body through the shaft, the shaft rotates the worm rod through the orthogonal gear set.

9. The foldable electronic device having multiple screens as described in claim 8, wherein the orthogonal gear set comprises a first helical gear and a second helical gear which are meshed with each other, the first helical gear is coaxially assembled to the shaft so that the first helical gear and the shaft rotate synchronously, and the second helical gear is coaxially assembled to the worm rod so that the second helical gear and the worm rod rotate synchronously.

* * * * *